US009887444B2

(12) United States Patent
Chen et al.

(10) Patent No.: US 9,887,444 B2
(45) Date of Patent: Feb. 6, 2018

(54) FILTER CAPABLE OF ADJUSTING FREQUENCY AND BANDWIDTH

(71) Applicant: Universal Microwave Technology, Inc., Keelung (TW)

(72) Inventors: Yu-Cheng Chen, Taipei (TW); Jen-Ti Peng, Keelung (TW); Jung-Chin Hsu, New Taipei (TW); Feng-Yuan Huang, Keelung (TW); Guo-Hong Li, Taoyuan (TW)

(73) Assignee: UNIVERSAL MICROWAVE TECHNOLOGY, INC, Keelung (TW)

( * ) Notice: Subject to any disclaimer, the term of this patent is extended or adjusted under 35 U.S.C. 154(b) by 197 days.

(21) Appl. No.: 14/848,161

(22) Filed: Sep. 8, 2015

(65) Prior Publication Data

US 2017/0069942 A1    Mar. 9, 2017

(51) Int. Cl.
*H01P 1/208*    (2006.01)
*H01P 7/06*    (2006.01)
*H05K 9/00*    (2006.01)

(52) U.S. Cl.
CPC ............... *H01P 1/208* (2013.01); *H01P 7/06* (2013.01); *H05K 9/0015* (2013.01)

(58) Field of Classification Search
CPC .......... H01P 1/208; H01P 7/06; H05K 9/0015

USPC ................. 333/202–212, 232, 233
See application file for complete search history.

(56) References Cited

U.S. PATENT DOCUMENTS 6,111,484 A *    8/2000 Henningsson ........ H01P 1/2053
333/207

* cited by examiner

*Primary Examiner* — Rakesh Patel
(74) *Attorney, Agent, or Firm* — Ming Chow; Sinorica, LLC

(57) ABSTRACT

A filter capable of adjusting frequency and bandwidth for dynamically setting at least one of the filter center frequency and bandwidth includes a first movable member, a second movable member, an upper casing, a lower casing, multiple conductive clamping members, a cavity and a driving module. The first and second movable members have multiple first and second lugs formed on the first and second boards respectively. The upper and lower casings have multiple upper and lower openings corresponsive to the first lugs and the second lugs respectively. The conductive clamping members are corresponsive to the upper openings and the lower openings. The cavity has multiple chambers and multiple connecting portions. The driving module changes the position of the first movable member to determine the filter center frequency and the position of the second movable member to determine the bandwidth.

10 Claims, 4 Drawing Sheets

FILTER CAPABLE OF ADJUSTING FREQUENCY AND BANDWIDTH

FIELD OF THE INVENTION

The present invention relates to the field of communications, in particular to a filter capable of adjusting frequency and bandwidth and dynamically setting filter center frequency and bandwidth.

BACKGROUND OF THE INVENTION

In the conventional filter manufacturing process, network analyzers are generally used for measurements, and the center frequency of the filter is adjusted manually. In other words, after the filter is calibrated, the center frequency is fixed and cannot be adjusted by users anymore. Since the filter is packaged, the involved process is very complicated even though the filter can be unpackaged, adjusted, and re-packaged. Similarly, the same applies to the adjustment of bandwidths.

After purchasing the filter, purchasers have to send the filter to the original factory to calibrate the center frequency, thus causing tremendous inconvenience to manufacturers. In general, the filters are integrated into related communication equipments, and the filters must be removed from the communication equipments before they can be adjusted separately. Obviously, such procedure is time-consuming and costly. In another situation, if the communication equipment is a communication base station, signal transmissions of the communication will be affected, or even the base station must be shut down during the process of removing the filters.

In view of the aforementioned drawbacks of the prior art, the present invention provides a filter capable of adjusting frequency and bandwidth to overcome the aforementioned drawbacks.

SUMMARY OF THE INVENTION

It is a primary objective of the present invention to provide a filter capable of adjusting frequency and bandwidth comprising a plurality of movable members, an upper casing, a lower casing, a plurality of conductive clamping members, a cavity and a driving module, wherein the movable members are configured to be corresponsive to the plurality of lugs and moved between the upper casing, the lower casing and the conductive clamping members respectively for dynamically determining at least one of the filter center frequency and bandwidth of the tunable filter.

Another objective of the present invention is to provide the aforementioned filter capable of adjusting frequency and bandwidth, wherein the movable members include first movable members configured to be corresponsive to the plurality of lugs and moved between the upper casing, the lower casing and the conductive clamping members respectively to change the depth of the lugs inside the a chamber of the cavity to dynamically determine the filter center frequency of the tunable filter.

A third objective of the present invention is to provide the aforementioned filter capable of adjusting frequency and bandwidth, wherein the movable members include second movable members configured to be corresponsive to the plurality of lugs and moved between the upper casing, the lower casing and the conductive clamping members respectively to change the depth of the lugs inside the plurality of connecting portions of the cavity to dynamically determine the bandwidth of the tunable filter, and the connecting portions are formed between the chambers.

A fourth objective of the present invention is to provide the aforementioned filter capable of adjusting frequency and bandwidth, wherein the conductive clamping members are electrically conductive and disposed between the upper casing and the lower casing, so that the lugs in the cavity have the effect of preventing leakage of electromagnetic waves.

A fifth objective of the present invention is to provide the aforementioned filter capable of adjusting frequency and bandwidth, wherein the driving module is provided for receiving a local and/or external control signal to control one of the movable members to move accurately in order to adjust the filter center frequency and bandwidth accurately, and maintain the original frequency response and related properties of the tunable filter.

To achieve the aforementioned and other objectives, the present invention provides a filter capable of adjusting frequency and bandwidth for dynamically setting at least one of the filter center frequency and bandwidth, wherein the filter capable of adjusting frequency and bandwidth comprises a first movable member, a second movable member, an upper casing, a lower casing, a plurality of conductive clamping members, a cavity and a driving module. The first movable member includes a first board and a plurality of first lugs. The first lugs are formed on a side of the first board. The second movable member includes a second board and a plurality of second lugs. The second lugs are formed on a side of the second board. The upper casing is disposed on a side of the movable member. The upper casing has a plurality of upper openings configured to be corresponsive to the first lugs and the second lugs respectively. The lower casing is disposed on a side of the upper casing. The lower casing has a plurality of lower openings corresponsive to the upper openings respectively. The conductive clamping members are disposed between the upper casing and the lower casing, and the conductive clamping members are configured to be corresponsive to the upper openings and the lower openings respectively. The cavity is combined with the lower casing. The cavity has as plurality of chambers and a plurality of connecting portions formed therein and configured to be corresponsive to the lower openings respectively, wherein the chambers are communicated with one another through the connecting portions. The driving module includes a first driving unit and a second driving unit. The first driving unit is coupled to the first movable member, and the second driving unit is coupled to the second movable member. The first driving unit drives the first movable member, so that the first lugs are moved in a first direction towards the chambers or in a second direction away from the chambers, and the second driving unit drives the second movable member, so that the second lugs are moved in the first direction towards the connecting portions or in the second direction away from the connecting portions. Wherein, at least one of the first lugs and the second lugs moves he upper openings, the conductive clamping members and the lower openings a distance towards the first direction or the second direction, and the filter center frequency is determined by the position of the first lugs, and the bandwidth is determined by the position of the second lugs.

Compared with the prior art, the filter capable of adjusting frequency and bandwidth of the present invention achieves the effect of dynamically and easily adjusting the filter center frequency and bandwidth by adjusting the depth of the lugs of the plurality of movable members entered into or moved away from the cavity or connecting portion by the driving module according to an external or local control signal.

With the aforementioned property, the filter capable of adjusting frequency and bandwidth of the present invention can maintain the original frequency response and other functions.

In addition, the present invention provides electrically conductive clamping members (or gaskets) disposed between the upper casing and the lower casing to prevent the leakage of electromagnetic waves.

DESCRIPTION OF THE PREFERRED EMBODIMENTS

The aforementioned and other objects, characteristics and advantages of the present invention will become apparent with the detailed description of the preferred embodiments and the illustration of related drawings as follows.

Figure 1:
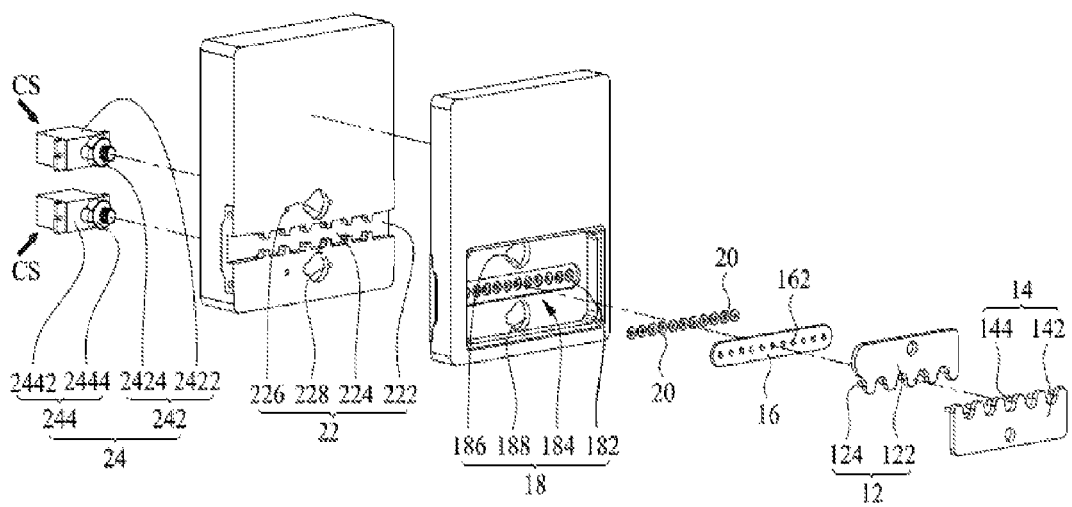
FIG. 1 is a schematic view of a filter capable of adjusting frequency and bandwidth in accordance with a preferred embodiment of the present invention.

With reference to FIG. 1 for a schematic view of a filter capable of adjusting frequency and bandwidth in accordance with a preferred embodiment of the present invention, the tunable filter 10 is provided for dynamically setting at least one of the filter center frequency and bandwidth.

The tunable filter 10 comprises a first movable member 12, a second movable member 14, an upper casing 16, a lower casing 18, a plurality of conductive clamping members 20, a cavity 22 and a driving module 24.

The first movable member 12 includes a first board 122 and a plurality of first lugs 124. The first board 122 is a T-shape board. In other embodiments, the shape of the board 122 is not limited to the T-shape. The first lugs 124 are formed at the bottom of the first board 122. In this preferred embodiment, the first lugs 124 have the same length. In other embodiments, the first lugs 124 may be of unequal lengths or adjusted as needed.

The second movable member 14 includes a second board 142 and a plurality of second lugs 144. The second board 142 is a rectangular board. The second lugs 144 are formed at the bottom of the second board 142. The second movable member 14 is substantially the same as the first movable member 12, and thus its description will not be repeated.

The upper casing 16 is disposed under the first movable member 12 and the second movable member 14. The upper casing 16 includes a plurality of upper openings 162, and each of the upper openings 162 is configured to each respective first lug 124 and each respective second lug 144.

The lower casing 18 is disposed under the upper casing 16. The lower casing 18 includes a plurality of lower openings 182, and each of the lower openings 182 is configured to be corresponsive each respective upper opening 162. In this preferred embodiment, the lower casing 18 has a containing space 184 formed therein and provided for containing the first movable member 12 and the second movable member 14.

The conductive clamping members 20 are disposed between the upper casing 16 and the lower casing 18, and each of the conductive clamping members 20 is configured to be corresponsive to each respective upper opening 162 and each respective lower opening 182. Wherein, the conductive clamping members 20 are made of conductors. The conductive clamping members 20 may be O-rings. In this preferred embodiment, the conductive clamping members 20 are clamped between the upper casing 16 and the lower casing 18. The size of the conductive clamping members 20 is smaller than or equal to the diameter of the first lugs 124 and the diameter of the second lug. After the first lugs 124 are plugged with the conductive clamping members 20, the first lugs 124 are closely clamped with the conductive clamping members 20 to prevent the electromagnetic waves from leaking out from the cavity 22.

The cavity 22 is combined with the lower casing 18. The cavity 22 has a plurality of chambers 222 and a plurality of connecting portions 224. The chambers 222 and the connecting portions 224 are configured to be corresponsive the lower openings 182 respectively. Wherein, the chambers 222 are communicated with one another through the connecting portions 224. In this preferred embodiment, the chambers 222 are in a circular shape, and the connecting portions 224 are in a rectangular shape. In other embodiments, they are not limited to the aforementioned shapes only.

Figure 2:
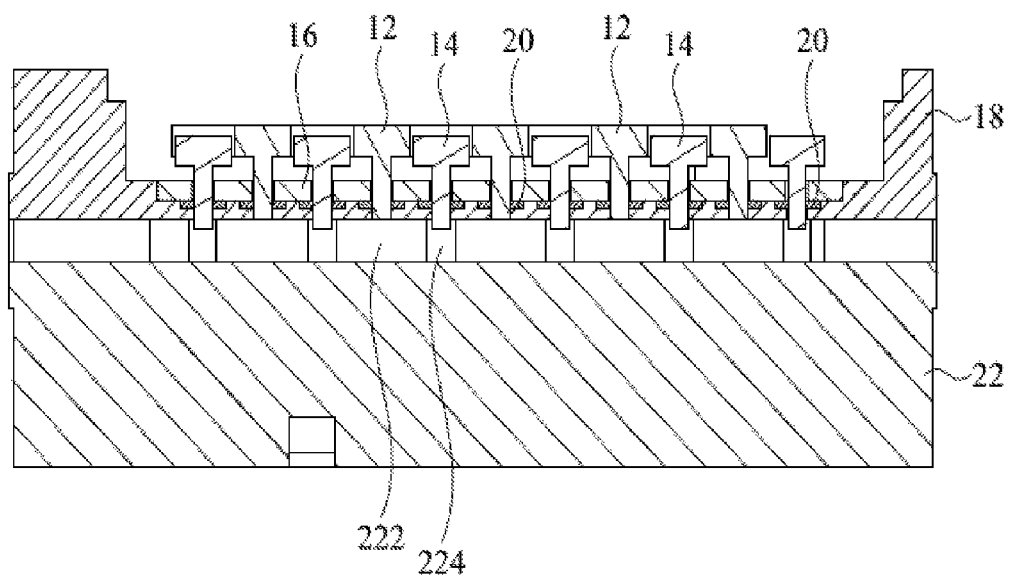
FIG. 2 is a cross-sectional view showing a first movable member, a second movable member, an upper casing, a lower casing, a conductive clamping members and a cavity combined with the filter as depicted in FIG. 1.

With reference to FIG. 2 for a cross-sectional view showing the first movable member 12, the second movable member 14, the upper casing 16, the lower casing 18, the conductive clamping members 20 and the cavity 22 combined with the filter, the driving module 24 includes a first driving unit 242 and a second driving unit 244. The first driving unit 242 is coupled to the first movable member 12, and the second driving unit 244 is coupled to the second movable member 14. The first driving unit 242 drives the first movable member 12 to move the first lugs 124 in a first direction towards the chambers 222, so that the first lugs 124 move in a −Y direction towards the chambers 222 or in a +Y direction away from the chambers 222. The second driving unit 244 drives the second movable member 14 to move the second lugs 144 in a −Y direction towards the connecting portions 224 and move the second lugs 144 in a −Y direction towards the cavities 222 or a +Y direction away from the connecting portions 224.

In this preferred embodiment, the first driving unit 242 and the second driving unit 244 may be motors 2422, 2442 and link rods 2424, 2444. The motor 2422, 2442 is coupled to the link rod 2424, 2444. The link rod 2424 is coupled to the first movable member 12, and the link rod 2424 is coupled to the second movable member 14. The motor 2422, 2442 receives a control signal CS to drive the link rod 2424, 2444 to move and adjust a distance in a −Y direction towards the chambers 222 (or the connecting portions 224) or a +Y direction away from the chambers 222 (or the connecting portions 224). Wherein, the first driving unit 242 and the second driving unit 244 are the ones selected from the group of servomotors and stepper motors.

In this preferred embodiment, the upper casing 16 has a first upper hole 186 and the lower casing 18 has a first lower hole 226, and the link rod 2424 is passed through the first upper hole 186 and the first lower hole 226 to connect the first board 122. Similarly, the upper casing 16 has a second upper hole 188 and the lower casing 18 has a second lower hole 228, and the link rod 2444 is passed through the second upper hole 188 and the second lower hole 228 to connect the second board 142.

Figure 3:
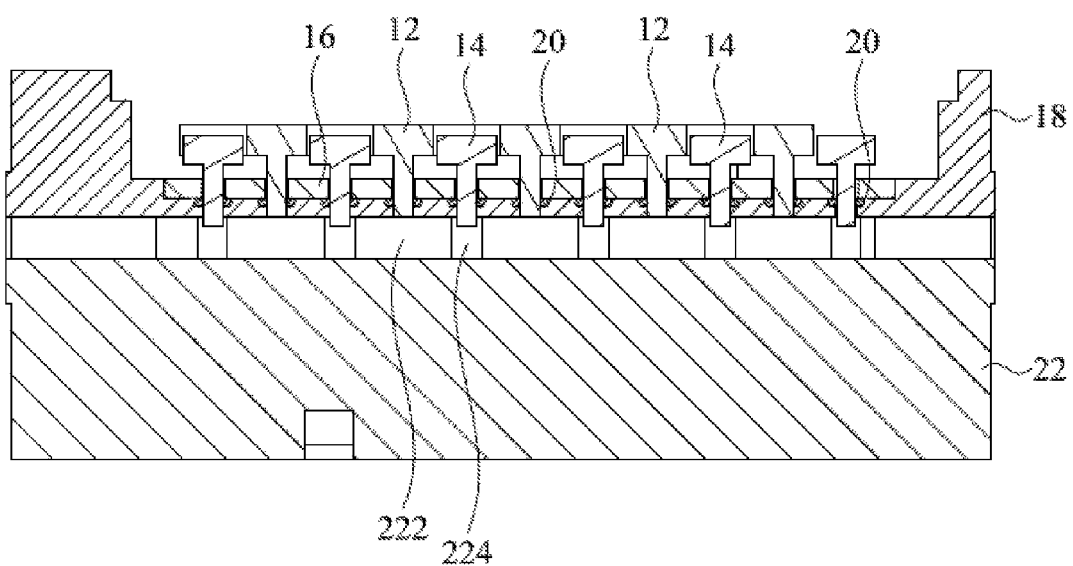
FIG. 3 is another cross-sectional view showing an upper casing, a lower casing, and a conductive clamping member combined with the filter as depicted in FIG. 1.
Figure 4:
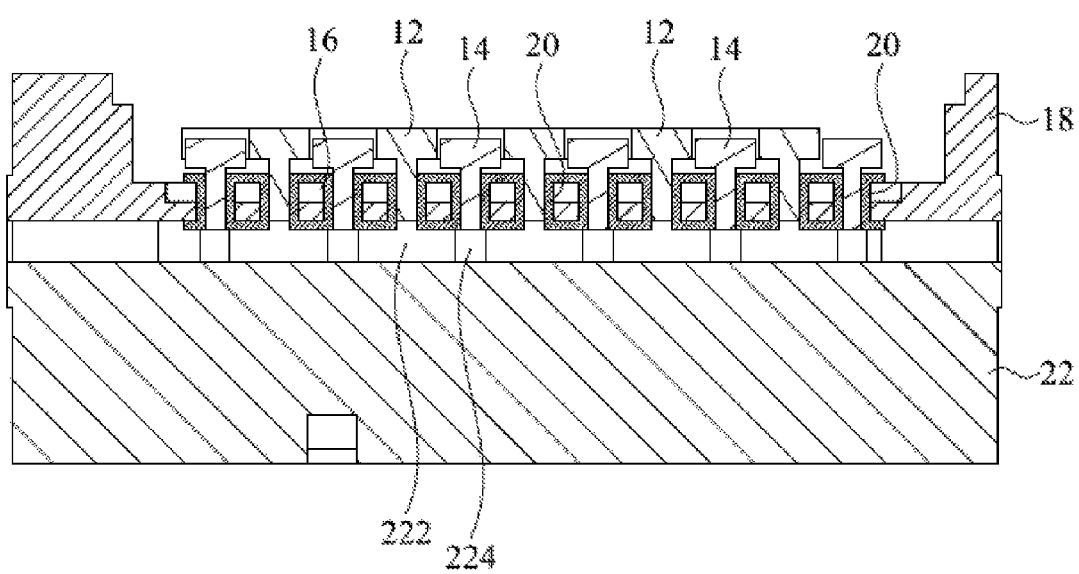
FIG. 4 is a further cross-sectional view showing an upper casing, a lower casing, and a conductive clamping member combined with the filter as depicted in FIG. 1.

With reference to FIGS. 3 and 4 for other cross-sectional views of the upper casing, the lower casing and the conductive clamping member combined with the filter of the present invention respectively, FIG. 3 shows that the upper casing 16 and the lower casing 18 are integrally formed, and the upper openings 162 are communicated with the lower openings 182. A notch is formed between the upper openings 162 and the lower openings 182 for accommodating the conductive clamping members 20 to achieve the aforementioned effect.

In FIG. 4, the upper casing 16 and the lower casing 18 are covered by the conductive clamping members 20 to achieve the aforementioned effect.

It is noteworthy that the aforementioned embodiment adopts one filter, but the invention is not limited to such arrangement only. In other embodiments, there may be a plurality of filters connected in series or in parallel.

While the invention has been described by means of specific embodiments, numerous modifications and variations could be made thereto by those skilled in the art without departing from the scope and spirit of the invention set forth in the claims.

What is claimed is:

1. A filter capable of adjusting frequency and bandwidth, for dynamically setting at least one of a center frequency and a bandwidth of the filter, and the filter comprising:
    a first movable member, having a first board, and a plurality of first lugs formed on a side of the first board;
    a second movable member, having a second board, and a plurality of second lugs formed on a side of the second board;
    an upper casing, installed on the side of the first board and the side of the second board, and having a plurality of upper openings configured to be corresponsive to the plurality of first lugs and the plurality of second lugs respectively;
    a lower casing, installed on a side of the upper casing, and having a plurality of lower openings configured to be corresponsive to the plurality of upper openings respectively;
    a plurality of conductive clamping members, disposed between the upper casing and the lower casing, and configured to be corresponsive to the plurality of upper openings and the plurality of lower openings respectively;
    a cavity, combined with the lower casing, and having a plurality of chambers and a plurality of connecting portions, and the plurality of chambers and the plurality of connecting portions being configured to be corresponsive to the plurality of lower openings respectively, and the plurality of chambers communicating with one another through the plurality of connecting portions;
    a driving module, having a first driving unit and a second driving unit, and the first driving unit being coupled to the first movable member, and the second driving unit being coupled to the second movable member, and the first driving unit driving the first movable member to move the plurality of first lugs in a first direction towards the plurality of chambers or in a second direction away from the plurality of chambers, and the second driving unit driving the second movable member to move the plurality of second lugs in the first direction towards the plurality of connecting portions or in the second direction away from the plurality of connecting portions; and
    at least one of the plurality of first lugs and the plurality of second lugs being situated at the plurality of upper openings, the plurality of conductive clamping members and the plurality of lower openings moving a distance in the first direction or the second direction, the center frequency being determined by the position of the plurality of first lugs, the bandwidth being determined by the position of the plurality of second lugs.

2. The filter capable of adjusting frequency and bandwidth as claimed in claim 1, wherein the plurality of conductive clamping members have a diameter that is not greater than a diameter of the plurality of first lugs and the plurality of second lugs, and the diameter of the plurality of first lugs is the same as the diameter of the plurality of second lugs.

3. The filter capable of adjusting frequency and bandwidth as claimed in claim 1, wherein the plurality of first lugs and the plurality of second lugs are alternately installed, and the plurality of first lugs and the plurality of second lugs are selectively arranged along a same axis.

4. The filter capable of adjusting frequency and bandwidth as claimed in claim 1, wherein the first driving unit and the second driving unit further include a motor and a link rod, and the motor is coupled to the link rod, and the link rod is coupled to the first movable member and the second movable member, and the motor receives a control signal to drive the link rod to move, so as to adjust the distance in the first direction or the second direction.

5. The filter capable of adjusting frequency and bandwidth as claimed in claim 4, wherein the motor is one selected from the group consisting of a servomotor and a stepper motor.

6. The filter capable of adjusting frequency and bandwidth as claimed in claim 5, wherein the lower casing has a containing space formed therein and provided for containing the first movable member, the second movable member, the upper casing and the plurality of conductive clamping members.

7. The filter capable of adjusting frequency and bandwidth as claimed in claim 6, wherein the lower casing has a first upper hole and a second upper hole formed thereon, and the link rod is passed through the first upper hole and the second upper hole to connect the first board and the second board respectively.

8. The filter capable of adjusting frequency and bandwidth as claimed in claim 6, wherein the lower casing has a first upper hole and a first lower hole, and the link rod is passed through the first upper hole and the first lower hole to connect the first board; and the lower casing has a second upper hole and a second lower hole, and the link rod is passed through the second upper hole and the second lower hole to connect the second board.

9. The filter capable of adjusting frequency and bandwidth as claimed in claim 1, wherein the upper casing and the lower casing are integrally formed, and the plurality of upper openings are communicated with the plurality of lower openings respectively.

10. The filter capable of adjusting frequency and bandwidth as claimed in claim 9, wherein the plurality of conductive clamping members are disposed in the plurality of upper openings and the plurality of lower openings, or the plurality of conductive clamping members cover the upper casing and the lower casing.

* * * * *